United States Patent
Higuchi et al.

(10) Patent No.: US 9,178,050 B2
(45) Date of Patent: *Nov. 3, 2015

(54) LOAD-SHORT-CIRCUIT-TOLERANT SEMICONDUCTOR DEVICE HAVING TRENCH GATES

(75) Inventors: Yasushi Higuchi, Okazaki (JP);
Shigemitsu Fukatsu, Okazaki (JP);
Masakiyo Sumitomo, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/347,077

(22) PCT Filed: Sep. 13, 2012

(86) PCT No.: PCT/JP2012/005823
§ 371 (c)(1),
(2), (4) Date: Mar. 25, 2014

(87) PCT Pub. No.: WO2013/046578
PCT Pub. Date: Apr. 4, 2013

(65) Prior Publication Data
US 2014/0217464 A1  Aug. 7, 2014

(30) Foreign Application Priority Data

Sep. 27, 2011 (JP) ................................ 2011-211072
Sep. 6, 2012 (JP) ................................ 2012-196549

(51) Int. Cl.
*H01L 29/66* (2006.01)
*H01L 29/739* (2006.01)
(Continued)

(52) U.S. Cl.
CPC ........ *H01L 29/7397* (2013.01); *H01L 29/0834* (2013.01); *H01L 29/0843* (2013.01);
(Continued)

(58) Field of Classification Search
CPC ............ H01L 29/0834; H01L 29/0843; H01L 29/1095; H01L 29/4236; H01L 29/42368; H01L 29/42376; H01L 29/66348; H01L 29/7397

USPC ................ 257/139, 141–142, 328, 565, 341; 438/270

See application file for complete search history.

(56) References Cited

U.S. PATENT DOCUMENTS 4,532,534 A * 7/1985 Ford et al. ...................... 257/341
4,672,407 A * 6/1987 Nakagawa et al. ........... 257/142
(Continued)

FOREIGN PATENT DOCUMENTS

JP H07-083112 B2 9/1995
JP 2002-270842 A 9/2002
(Continued)

OTHER PUBLICATIONS

International Search Report and Written Opinion of the International Searching Authority mailed Nov. 13, 2012 for the corresponding internation application No. PCT/JP2012/005823 (with English translation).

*Primary Examiner* — Mohammed Shamsuzzaman
(74) *Attorney, Agent, or Firm* — Posz Law Group, PLC

(57) ABSTRACT

In a semiconductor device, a trench gate has a bottom portion in a drift layer and a communication portion extending from a surface of a base layer to communicate with the bottom portion. A distance between adjacent bottom portions is smaller than a distance between adjacent communication portions in a x-direction. A region between adjacent trench gates is divided in a y-direction into an effective region as an electron injection source and an ineffective region which does not serve as the electron injection source. An interval $L_1$ (>0) of the ineffective region in the y-direction, a length $D_1$ of the communication portion in the z-direction, and a length $D_2$ of the bottom portion in the z-direction satisfy $L_1 \leq 2(D_1+D_2)$. The z-direction is orthogonal to a x-y plane defined by the x-direction and the y-direction which are orthogonal to each other.

8 Claims, 11 Drawing Sheets

(51) Int. Cl.
*H01L 29/08* (2006.01)
*H01L 29/423* (2006.01)
*H01L 29/10* (2006.01)

(52) U.S. Cl.
CPC ........ *H01L29/1095* (2013.01); *H01L 29/4236* (2013.01); *H01L 29/42368* (2013.01); *H01L 29/42376* (2013.01); *H01L 29/66348* (2013.01)

(56) References Cited

U.S. PATENT DOCUMENTS

| | | | |
|---|---|---|---|
| 5,023,691 A * | 6/1991 | Hagino | 257/139 |
| 5,321,281 A | 6/1994 | Yamaguchi et al. | |
| 5,904,525 A | 5/1999 | Hshieh et al. | |
| 2002/0022324 A1 * | 2/2002 | Hueting et al. | 438/270 |
| 2005/0263852 A1 * | 12/2005 | Ogura et al. | 257/565 |
| 2006/0214221 A1 * | 9/2006 | Challa et al. | 257/328 |
| 2006/0267085 A1 | 11/2006 | Matsuura | |
| 2007/0001263 A1 | 1/2007 | Nakagawa | |
| 2008/0054351 A1 | 3/2008 | Ooki | |
| 2012/0056241 A1 * | 3/2012 | Sumitomo et al. | 257/139 |
| 2012/0146091 A1 * | 6/2012 | Tanabe et al. | 257/139 |
| 2014/0339602 A1 * | 11/2014 | Higuchi et al. | 257/141 |

FOREIGN PATENT DOCUMENTS

| | | |
|---|---|---|
| JP | 2005-158850 A | 6/2005 |
| JP | 2008-153389 A | 7/2008 |
| JP | 2013-214696 A | 10/2013 |

* cited by examiner

US 9,178,050 B2

LOAD-SHORT-CIRCUIT-TOLERANT SEMICONDUCTOR DEVICE HAVING TRENCH GATES

CROSS REFERENCE TO RELATED APPLICATION

The present disclosure is a U.S. national stage application of PCT/JP2012/005823 filed on Sep. 13, 2012 and is based on Japanese Patent Application No. 2011-211072 filed on Sep. 27, 2011 and 2012-196549 filed on Sep. 6, 2012, the contents of which are incorporated herein by reference.

TECHNICAL FIELD

The present disclosure relates to a semiconductor device having an insulated-gate bipolar transistor (hereinafter referred to simply as the IGBT).

BACKGROUND ART

A semiconductor device having an IGBT is used in an electronic circuit for driving an inductive load such as a motor. A semiconductor device having a typical IGBT has the following structure.

An $N^-$-type drift later is formed on a $P^+$-type collector layer, a P-type base layer is formed in a surface portion of the $N^-$-type drift layer, and an $N^+$-type emitter layer is formed in a surface portion of the P-type base layer. Multiple trenches, which reach the $N^-$-type drift layer by penetrating the P-type base layer and the $N^+$-type emitter layer, are formed in a pattern of stripes. A gate insulation layer and a gate electrode are formed in order on a wall of each trench so that a trench gate can be formed with the trench, the gate insulation layer, and the gate electrode. Further, an emitter electrode is formed on the P-type base layer and the N+-type emitter layer through an interlayer dielectric film. The emitter electrode is electrically connected to the P-type base layer and the N+-type emitter layer through a contact hole of the interlayer dielectric film. Further, a collector electrode is formed on a back side of a collector layer and electrically connected to the collector.

In this type of semiconductor device, when a predetermined gate voltage is applied to the gate electrode, an N-type inversion layer is formed in the P-type base layer at an interface with the gate insulation layer in the trench, and an electron accumulation layer is formed in the N-type drift layer at an interface with the gate insulation layer in the trench. Electrons flow into the $N^-$-type drift layer from the $N^+$-type emitter layer through the inversion layer and the accumulation layer, and holes flow into the $N^-$-type drift layer. Thus, a resistance decreases due to conductivity modulation so that it can change to an ON state.

In this type of semiconductor device having an IGBT, an ON voltage can be lowered compared to a semiconductor device having a MOSFET Recently, however, there has been a demand for a further reduction in an ON voltage.

For the above reason, for example, a patent document 1 discloses that a distance between adjacent gate electrodes is reduced to a very small value from 0.55 nm to 0.3 μm.

Further, a patent document 2 discloses that a trench gate has an enlarged portion which is located in an $N^-$-type drift layer and has a width larger than a width of a portion other than the enlarged portion. Accordingly, a distance between the enlarged portions of adjacent trench gates is smaller than a distance between the other portions of adjacent trench gates.

In semiconductor devices as disclosed in the patent documents 1, 2, holes flowing into the $N^-$-type drift layer are less likely to be drawn to the P-type base layer through space between adjacent trench gates, so that a lot of holes are accumulated in the $N^-$-type drift layer. Thus, the amount of electrons flowing into the $N^-$-type drift layer from the $N^+$-type emitter layer through the inversion layer and the accumulation layer is increased. Since electron mobility is greater than hole mobility, an ON voltage is further reduced.

In the patent documents 1, 2, a low ON voltage is achieved. Recently, however, there has been a demand for a semiconductor device having not only a low ON voltage but also an improved load short-circuit tolerance.

That is, in such a semiconductor device, when a load short-circuit occurs, an electric current increases to saturation limited by the device. Then, Joule heat proportional to the salutation current is generated, so that a temperature of the semiconductor device increases. As a result, the semiconductor device may be broken.

PRIOR ART

Patent Document

Patent Document 1: JP-A-2007-43123
Patent Document 2: JP-A-2008-153389

SUMMARY OF THE INVENTION

In view of the above, it is an object of the present disclosure to provide a semiconductor having not only a low ON voltage but also an improved load short-circuit tolerance.

According to a first aspect of the present disclosure, a semiconductor device includes a first-conductivity-type collector layer along a x-y plane defined by a x-direction and a y-direction which are orthogonal to each other, a second-conductivity-type drift layer formed on a front side of the collector layer, a first-conductivity-type base layer formed on the drift layer, trench gates, a second-conductivity-type emitter layer formed in a surface portion of the base layer and located on a side of the trench gate, a collector electrode formed on a back side of the collector layer and electrically connected to the collector layer, and an emitter electrode electrically connected to the emitter layer and the base layer. The trench gates include trenches extending in the y-direction to form a pattern of stripes, a gate insulation layer formed on walls of the trenches, and a gate electrode formed on the gate insulation layer. The trenches extend from a surface of the base layer along the x-y plane to an inside of the drift layer by penetrating the base layer in a z-direction orthogonal to the x-y plane. Each trench gate includes a bottom portion located in the drift layer and a communication portion extending from the surface of the base layer to communicate with the bottom portion. A distance between adjacent bottom portions in the x-direction is smaller than a distance between adjacent communication portions in the x-direction. The gate insulation is thicker in the bottom portion than in the communication portion. A region between adjacent trench gates is divided into an effective region and an ineffective region in the y-direction. The effective region corresponds to the emitter layer and serves as an injection source for injecting charges into the drift layer when a voltage is applied to the gate electrode. The ineffective region does not serve as the injection source even when the voltage is applied to the gate electrode. An interval $L_1 (>0)$ of the ineffective region in the y-direction, a length $D_1$ of the communication portion in the z-direction, and a length $D_2$ of the bottom portion in the z-direction satisfy the following relationship: $L_1 \leq 2(D_1+D_2)$.

According to the first aspect, the distance between adjacent trench gates is not constant in the z-direction. That is, it is not constant at the length of the surface portion of the base layer between adjacent trench gates. Specifically, the distance between adjacent bottom portions is smaller than a distance between adjacent communication portions. Thus, transfer of holes injected into the drift layer is limited compared to when the distance between adjacent trench gates is constant at the length of the surface portion of the base layer between adjacent trench gates. Accordingly, a lot of holes can be accumulated in the drift layer. Because of the accumulated holes, the amount of electrons supplied to the drift layer from the emitter layer through an inversion layer and an accumulation layer is increased, so that an ON voltage is reduced.

The fact that the distance between adjacent bottom portions is smaller than the distance between adjacent communication portions means that the length of the surface portion of the base layer between adjacent communication portions is greater than the distance between adjacent bottom portions. Therefore, the following advantages can be obtained compared to a semiconductor device, such as disclosed in the patent document 1, in which the distance between adjacent trench gates is constant at a very small value. Since adjacent inversion layers, which are created during ON period, are less likely to come in contact with each other, an increase in a saturation current can be reduced. Further, contact areas of the base layer and the emitter layer connected to the emitter electrode are increased, so that a contact resistance is reduced. Thus, the ON voltage is reduced. In addition, contact areas of the base layer and the emitter layer connected to the emitter electrode are increased. Therefore, for example, alignment adjustment performed when electrodes are formed becomes easy so that manufacturing process can be simplified.

Further, according to the first aspect, the thickness of the gate insulation layer formed on a wall of the bottom portion of the trench is greater than the thickness of the gate insulation layer formed on a wall of the communication portion of the trench. Thus, the thickness of the accumulation layer, which is formed in a portion of the drift layer in contact with the gate insulation layer of the trench gate, is reduced compared to when the thickness of the gate insulation layer is constant at the thickness of the gate insulation layer formed on the wall of the communication portion. Thus, the saturation current is reduced, and a load short-circuit tolerance is improved.

Further, according to the first aspect, the effective region is divided in an extension direction of the trench gate, i.e., in the y-direction. In other words, the ineffective region is located between adjacent effective regions in the y-direction. Therefore, a ratio of the effective region width to the trench gate length is small compared to a conventional structure where the effective region is continuous. That is, a current density due to electrons injected into the drift layer from the emitter layer is small compared to the structure where the effective region is continuous. Thus, a saturation current of an IGBT is reduced.

Further, according to the first aspect, a structure as an IGBT satisfies the following relationship: $L_1 \leq 2(D_1+D_2)$. In this structure, transfer pathways for electrons transferred from the divided emitter layers to the drift layer overlap at a depth not greater than a depth corresponding to the length $(D_1+D_2)$ of the trench gate in the z-direction. That is, a voltage drop at a portion of the drift layer located at a depth greater than the length $(D_1+D_2)$ measured from the surface of the base layer in the z-direction can be almost the same as when the emitter layer has a continuous structure. In general, in an IGBT element, a ratio of a voltage drop at the drift layer to a voltage drop component is high. An ON voltage of an IGBT can be efficiently reduced by reducing an ON voltage at the drift layer. Therefore, an increase in the ON voltage can be reduced by reducing a voltage drop at the drift layer. Further, since the structure has both the effective region and the ineffective region, the saturation current is reduced, and the load short-circuit tolerance is improved.

According to a second aspect of the present disclosure, the effective region is arranged at the interval $L_1$ in the y-direction, and the ineffective region is located between adjacent effective regions in the y-direction.

According to the second embodiment, the emitter layer is divided in the extension direction of the trench gate, i.e., in the y-direction. In other words, the base layer is located between adjacent emitter layers in the y-direction. In a region where the emitter layer is formed, when the voltage is applied to the gate electrode, electrons are injected into the drift layer from the emitter layer. In contrast, in a region where no emitter layer is formed, no electron is injected into the drift layer from the surface portion of the base layer in contact with the trench gate. That is, in the y-direction, a region, where the emitter layer as an electron injection source is formed, corresponds to the effective region, and a region between adjacent effective regions corresponds to the ineffective region. In this structure, a ratio of the emitter layer width to the trench gate length is small compared to a structure where the emitter layer is continuous. That is, a current density due to electrons injected into the drift layer from the emitter layer is small compared to the structure where the emitter layer is continuous. Thus, a saturation current of an IGBT is reduced.

In this structure, a voltage drop at a portion of the drift layer located at a depth greater than the length $(D_1+D_2)$ measured from the surface of the base layer in the z-direction can be almost the same as when the emitter layer has a continuous structure. Therefore, the voltage drop at the drift layer is reduced so that the increase in the ON voltage can be reduced. Further, because of the divided emitter structure, the saturation current is reduced, and the load short-circuit tolerance is improved.

According to a third aspect of the present embodiment, a first-conductivity-type first high concentration base region is formed in the surface portion of the base layer in the ineffective region, and an impurity concentration of the first high concentration base region is higher than that of the base layer.

In this structure, a contact resistance between the emitter electrode, which is formed on the surfaces of the emitter layer and the base layer, and the base layer is reduced compared to a structure having no first high concentration base region. Thus, a potential of the base layer is stabilized, and an electrical surge tolerance is improved.

According to a fourth aspect of the present embodiment, the emitter layer continuously extends in the y-direction along the trench gate, and the ineffective region includes a first-conductivity-type second high concentration base region having an impurity concentration higher than that of the base layer and lower than that of the emitter layer. The second high concentration base region is intermittently divided and arranged at the interval L1 in the y-direction. The second high concentration base region is located in the base layer. The second high concentration base region is in contact with the emitter layer in the z-direction and in contact with the trench gate in the x-direction. The effective region is located between adjacent second high concentration base regions.

According to the fourth aspect, the second high concentration base region is divided in the y-direction, in contact with the emitter layer in the z-direction, and in contact with the trench gate in the x-direction. The second high concentration base region has an impurity concentration higher than that of the base layer. Therefore, when the voltage is applied to the gate electrode, the second high concentration base region is less likely to be inverted than the base layer. That is, a region, which is located between adjacent trench gates in the y-direction and where the second high concentration base region is formed, corresponds to the ineffective region where no electron is injection into the drift layer from a region in contact with the trench gate. In a region between adjacent second high concentration base regions in the y-direction, electrons are injected into the drift layer from the emitter layer. That is, this region corresponds to the effective region where the emitter layer serves as an electron injection source. Even in this structure, the ineffective region is divided. Accordingly, the effective region is also divided. Therefore, a ratio of the width of the emitter layer as the injection source to the trench gate length is small compared to a structure where the effective region is continuous. That is, a current density due to electrons injected into the drift layer from the emitter layer is small compared to the structure where the effective region is continuous. Thus, a saturation current of an IGBT is reduced.

Further, according to the fourth aspect, a voltage drop at a portion of the drift layer located at a depth greater than the length ($D_1+D_2$) measured from the surface of the base layer in the z-direction can be almost the same as when the emitter layer has a continuous structure. Therefore, the voltage drop at the drift layer is reduced, the increase in the ON voltage is reduced, the saturation current is reduced, and the load short-circuit tolerance is improved.

According to a fifth aspect of the present disclosure, the following relationship is satisfied: $L_1 \leq 2D_1$.

According to the fifth aspect, transfer pathways for electrons transferred from the emitter layers of the divided effective regions to the drift layer overlap at a depth not greater than a depth corresponding to the length ($D_1$) of the communication portion in the z-direction. In other words, the electron transfer pathways overlap in the base layer. Thus, a voltage drop at the entire drift layer and a portion deeper than the drift layer can be almost the same as when the effective region has a continuous structure. That is, a voltage drop at the drift layer corresponding to the bottom portion can be more effectively reduced. Therefore, the increase in the ON voltage is reduced, while the saturation current is reduced because of the divided effective region.

According to a sixth aspect of the present disclosure, $L_1$ and $D_1$ satisfy the following relationship: $D_1 \leq L_1$. When the relationship $D_1 \leq L_1$ is satisfied, the saturation current is effectively reduced. The saturation current decreases with an increase in $L_1$. An absolute value of a change rate, i.e., a slope increases with the increase in $L_1$ and becomes constant within a region where $D_1 \leq L_1$. Therefore, when $L_1$ and $D_1$ satisfy the relationship $D_1 \leq L_1$, the saturation current is effectively reduced.

According to a seventh aspect of the present disclosure, the effective region has a periodic structure so that each of the $L_1$ and a length $L_2$ of the effective region in the y-direction is constant.

In this structure, dependencies of the ON voltage and the saturation current on a position on the x-y plane are reduced. Thus, the ON voltage and the saturation current are stabilized.

According to an eighth aspect of the present disclosure, a first-conductivity-type base contact layer is formed in the surface portion of the base layer between the emitter layers between adjacent trench gates. The base contact layer extends to a depth greater than a depth to which the emitter layer extends, and a length of the base contact layer in the x-direction is greater than the distance between adjacent bottom portions.

In this structure, holes are likely to be drawn during OFF period where no voltage is applied to the gate electrode compared to when no base contact layer is formed, when a depth of the base contact layer is smaller than a depth of the emitter layer, or when the length of the base contact layer in the x-direction is smaller than the distance between adjacent bottom portions. Thus, it is possible to reduce occurrence of latch-up.

BRIEF DESCRIPTION OF THE DRAWINGS

The above and other objects, features and advantages of the present disclosure will become more apparent from the following detailed description made with reference to the accompanying drawings. In the drawings.

EMBODIMENTS OF THE INVENTION

Embodiments of the present disclosure are described below with reference to the drawings in which like characters of reference indicate the same or equivalent parts. A plane defined by a x-direction and a y-direction orthogonal to the x-direction is defined as a x-y plane, and a direction orthogonal to the x-y plane is defined as a z-direction.

First Embodiment

Firstly, a structure of a semiconductor device 10 according to the present embodiment is described with reference to FIG. 1 and FIG. 2.

Figure 1:
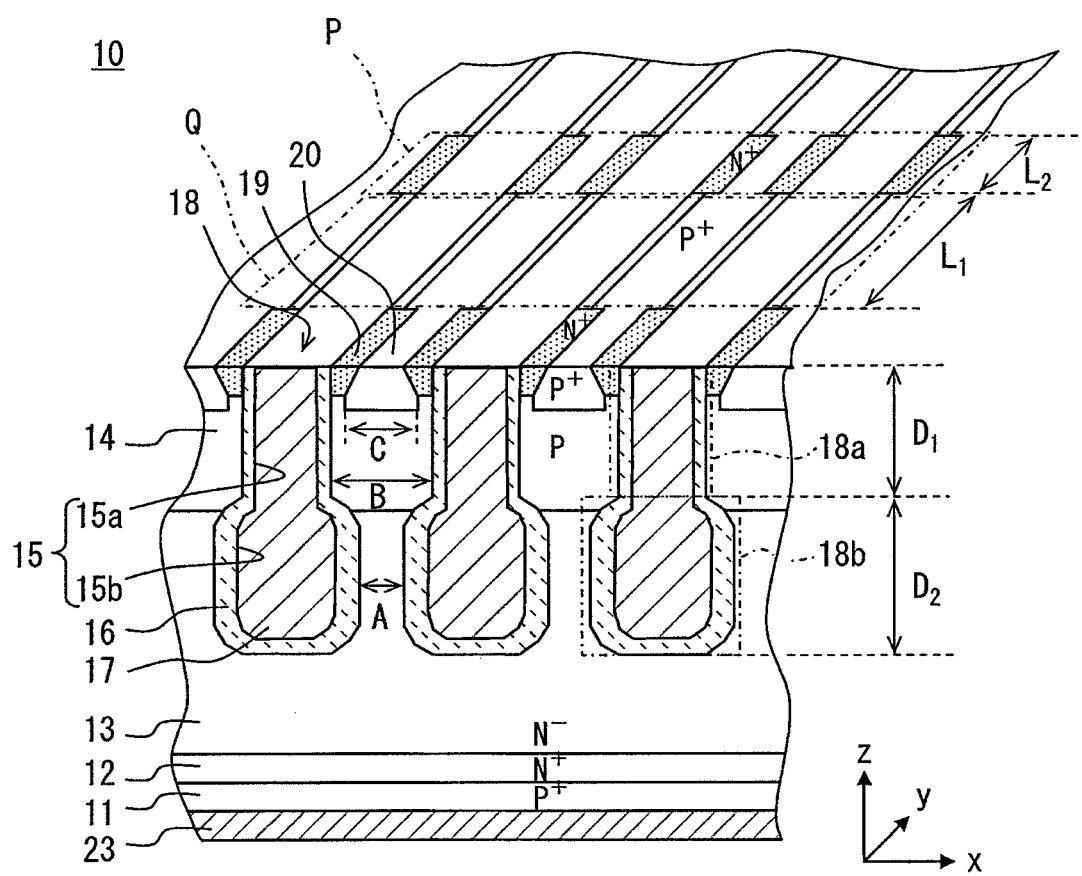
FIG. 1 is an overhead view of a semiconductor device according to a first embodiment.

As shown in FIG. 1, an $N^+$-type buffer layer 12, which has a predetermined thickness in the z-direction, is formed on a surface of a $P^+$-type collector layer 11, which is formed along the x-y plane and has a predetermined thickness in the x-direction. An $N^-$-type drift layer 13 having an impurity concentration lower than that of the buffer layer 12 is formed on a surface of the buffer layer 12. A P-type base layer 14 is formed on a surface of the drift layer 13. That is, the collector layer 11, the buffer layer 12, and the drift layer 13 are stacked in this order.

Multiple trenches 15, which penetrate the base layer 14 and reach the drift layer 13, extend in the y-direction to form a pattern of stripes. According to the present embodiment, the trench 15 is repeatedly formed in the x-direction at a regular gate pitch (e.g., 5.0 μm). A gate insulation layer 16 made of, for example, oxide film and a gate electrode 17 made of, for example, polysilicon, are formed in order on a side wall of the trench 15. Thus, the trench 15, the gate insulation layer 16, and the gate electrode 17 form a trench gate 18.

Each trench gate 18 has a communication portion 18a and a bottom portion 18b. The communication portion 18a extends from the surface of the base layer 14 to communicate with the bottom portion 18b. The bottom portion 18b is located in the drift layer 13. A width of the bottom portion 18b is greater than a width of the communication portion 18a in the x-direction. That is, a distance (denoted by "A" in FIG. 1) between adjacent bottom portions 18b in the x-direction is smaller than a distance (denoted by "B" in FIG. 1) between adjacent communication portions 18a in the x-direction. For example, "A" can be about 0.5 μm, and "B" can be about 1.5 μm.

The distance between the communication portions 18a in the x-direction can be translated as a length of the base layer 14 between adjacent trench gates 18 in the x-direction. The fact that the bottom portion 18b is located in the drift layer 13 can mean not only that the bottom portion 18b is formed only in the drift layer 13, but also that the bottom portion 18b is formed across an interface between the base layer 14 and the drift layer 13. According to the present embodiment, the bottom portion 18b is formed across the interface between the base layer 14 and the drift layer 13.

For example, a length $D_1$ of the communication portion 18a of the trench gate 18 in the z-direction can be about 3.0 μm, and a length $D_2$ of the bottom portion 18b of the trench gate 18 in the z-direction can be about 2.0 μm.

According to the present embodiment, the trench 15 of the trench gate 18 includes a second trench 15b located in the drift layer 13 and a first trench 15a extending from the surface of the base layer 14 to communicate with the second trench 15b. A distance between opposing walls of the first trench 15a is smaller than a distance between opposing walls of the second trench 15b in the x-direction. That is, a width of an opening of the first trench 15a is smaller than a width of an opening of the second trench 15b so that the trench 15 can be shaped like a vase. The trench gate 18 includes the gate insulation layer 16, which is formed in the first trench 15a and the second trench 15b, and the gate electrode 17 embedded in the trench 15.

A thickness of the gate insulation layer 16 formed on a wall of the second trench 15b is greater than a thickness of the gate insulation layer 16 formed on a wall of the first trench 15a. The thickness of the gate insulation layer 16 formed on the walls of the first trench 15a and the second trench 15b is the thickness of the gate insulation layer 16 in a direction perpendicular to the y-direction. For example, the thickness of the gate insulation layer 16 formed on the wall of the first trench 15a can be about 100 nm, and the thickness of the gate insulation layer 16 formed on the wall of the second trench 15b can be about 200 nm.

An $N^+$-type emitter layer 19 having an impurity concentration higher than that of the drift layer 13 is formed on the side of the trench gate 18 in a surface portion of the base layer 14. The emitter layer 19 is divided in multiple parts so that the emitter layer 19 can have a length $L_2$ (hereinafter referred to as an emitter width) in the y-direction and that the emitter layer 19 can be periodically arranged at an interval $L_1$ (hereinafter referred to as an emitter interval) in the y-direction. According to the present embodiment, $L_1$ is set to satisfy the following relationship: $D_1 \leq L_1 \leq 2(D_1+D_2)$. That is, according to the present embodiment, since $D_1$ is about 3.0 μm, and $D_2$ is about 2.0 μm, $L_1$ satisfies 3 μm$\leq L_1 \leq$10 μm. $L_1$ can be any value, as long as $L_1$ satisfies the above relationship. For example, according to the present embodiment, $L_1$ can be about 6.0 μm, and $L_2$ can be about 2.0 μm.

A region having the length $L_2$ in the y-direction, which is located between adjacent trench gates 18 and where the emitter layer 19 is formed, corresponds to an effective region (denoted by "P" in FIG. 1) recited in claims. A region having the length $L_2$ in the y-direction, which is located between adjacent effective regions P, corresponds to an ineffective region (denoted by "Q" in FIG. 1) recited in claims.

A $P^+$-type base contact layer 20 having an impurity concentration higher than that of the base layer 14 is formed between the emitter layers 19 between adjacent trench gates 18. According to the present embodiment, the base contact layer 20 extends from the surface of the base layer 14 to a depth greater than that of the emitter layer 19. Further, a length (denoted by "C" in FIG. 1) of the base contact layer 20 in the x-direction is greater than the distance (denoted by "A" in FIG. 1) between adjacent bottom portions 18b in the x-direction. According to the present embodiment, for example, "C" can be about 0.8 μm.

Figure 2:
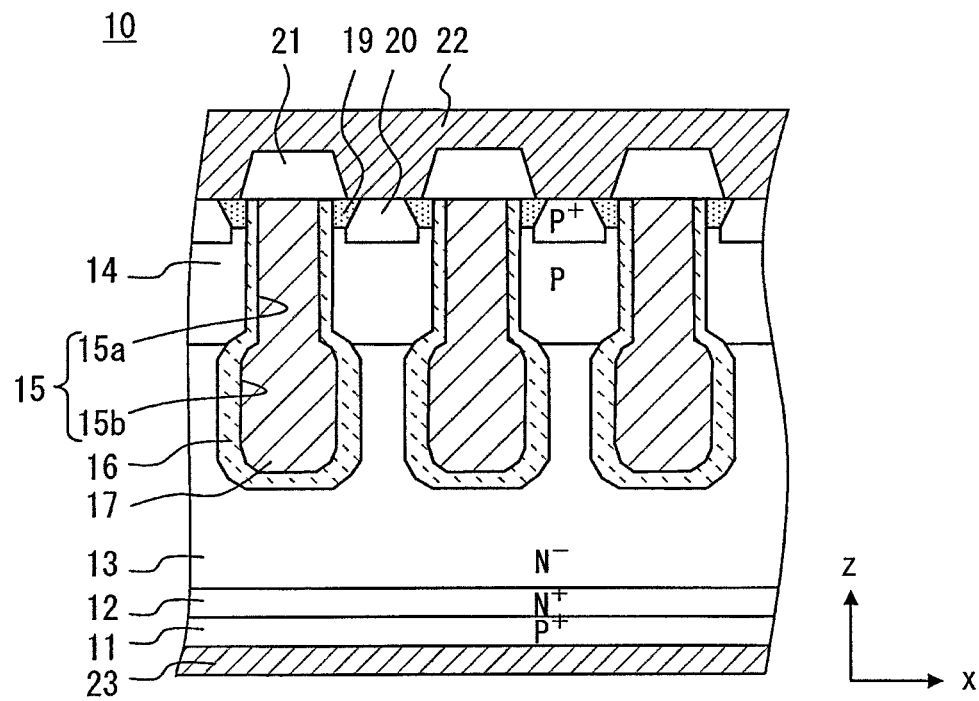
FIG. 2 is a cross-sectional view of the semiconductor device in a x-z plane.

Further, as shown in FIG. 2, an interlayer dielectric film 21 is formed on the surface of the base layer 14 where the emitter layer 19 is formed. The interlayer dielectric film 21 has a contact hole. An emitter electrode 22 is electrically connected to the emitter layer 19, the base layer 14, and the base contact layer 20 through the contact hole. It is noted that the gate electrode 17 and the emitter electrode 22 are insulated from each other by the interlayer dielectric film 21. A collector electrode 23 is formed on a back side of the collector layer 11 and electrically connected to the collector layer 11.

Advantages of the semiconductor device 10 according to the present embodiment are described with reference to FIGS. 3-6.

In the semiconductor device 10 according to the present embodiment, when a predetermined gate voltage is applied to the gate electrode 17, an N-type inversion layer is formed in the base layer 14 at an interface with the gate insulation layer 16 in the trench 15. Further, an electron accumulation layer is formed in the drift layer 13 at an interface with the gate insulation layer 16 in the trench 15. Electrons flow into the drift layer 13 from the emitter layer 19 through the inversion layer and the accumulation layer, and holes flow into the drift layer 13 from the collector layer 11. Thus, a resistance of the drift layer 13 decreases due to conductivity modulation so that it can change to an ON state.

According to the present embodiment, the distance "A" between adjacent bottom portions 18*b* in the x-direction is smaller than the distance "B" between adjacent communication portions 18*a* in the x-direction. Thus, transfer of holes injected into the drift layer 13 is limited compared to when the distance between adjacent trench gates 18 is almost constant in the z-direction at the length "B" of the surface portion of the base layer 14 between adjacent trench gates 18. Accordingly, a lot of holes can be accumulated in the drift layer 13. Because of the accumulated holes, the amount of electrons supplied to the drift layer 13 from the emitter layer 19 through the inversion layer and the accumulation layer can be increased. Therefore, an ON voltage can be reduced.

Further, according to the present embodiment, the gate insulation layer 16 is thicker in the second trench 15*b* than in the first trench 15*a*. Thus, the thickness of the accumulation layer can be reduced compared to when the thickness of the gate insulation layer 16 is constant at the thickness of the gate insulation layer formed in the first trench 15*a*. Therefore, a current pathway for a collector-emitter current is narrowed so that a saturation current can be reduced. Accordingly, a load short-circuit tolerance can be improved.

Figure 3:
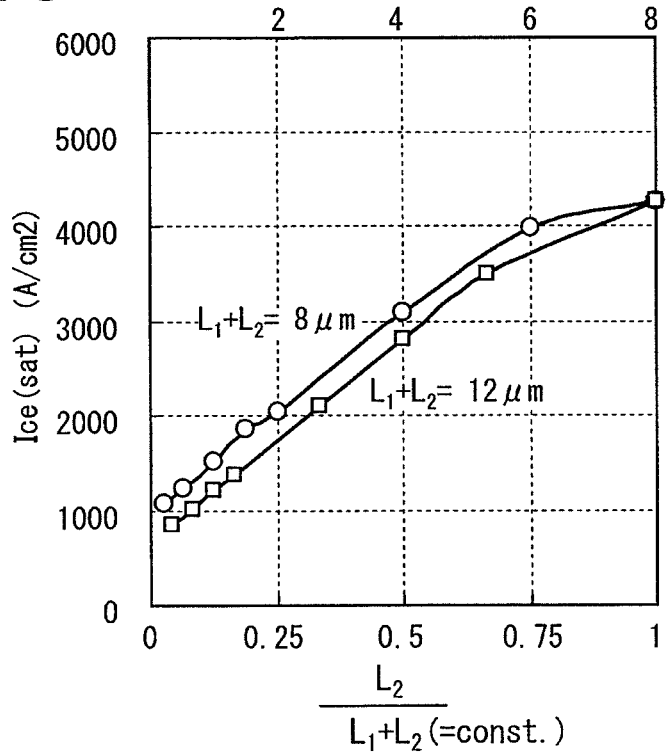
FIG. 3 is a graph showing a dependence of a saturation current on an emitter width.

Further, according to the present embodiment, the emitter layer 19 is divided in multiple parts so that the emitter layer 19 can have the emitter width $L_2$ and that the emitter layer 19 can be periodically arranged at the emitter interval $L_1$ in the y-direction. In other words, the base layer 14 is located between adjacent emitter layers 19 in the y-direction. Therefore, a ratio of the width of the emitter layer 19 to the length of the trench gate 18 in the y-direction is small compared to when the emitter layer 19 has a continuous structure. That is, a current density due to electrons injected into the drift layer 13 from the emitter layer 19 is small compared to when the emitter layer 19 has a continuous structure. Therefore, in the semiconductor device 10, the saturation current is reduced, and the load short-circuit tolerance is improved. FIG. 3 shows a result of simulation conducted to evaluate a salutation current Ice (sat) under conditions where a gate-emitter voltage Vg is 15V, a collector-emitter voltage Vice is 20V, and an operating temperature is 150° C. In this simulation, a pitch $(L_1+L_2)$ of the emitter layer 19 in the y-direction is constant, and the emitter width $L_2$ is variable. FIG. 3 shows a case where $L_1+L_2=12$ μm in addition to a case of the present embodiment $(L_1+L_2=8$ μm). As can be seen from FIG. 3, when a ratio of the emitter width $L_2$ to the pitch is reduced (when a ratio of the emitter interval $L_1$ to the pitch is increased), the salutation current Ice (sat) is reduced.

Figure 4:
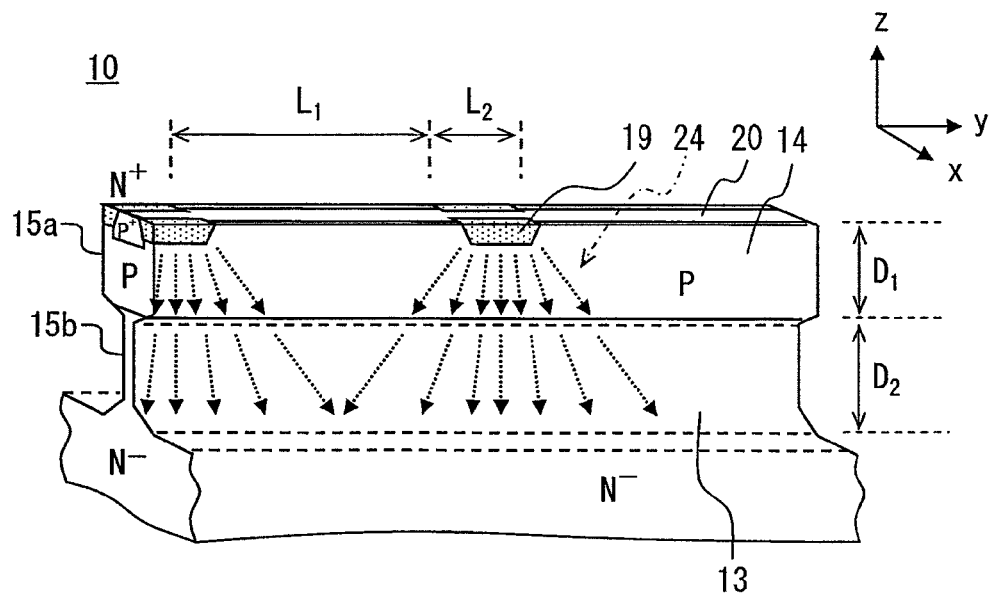
FIG. 4 is an overhead view showing an electron transfer pathway in the semiconductor device.

As shown in FIG. 4, a transfer pathway 24 for electrons injected into the drift layer 13 from the emitter layer 19 include not only the z-direction, but also a direction parallel to the x-y plane. That is, since the emitter layer 19 has a divided structure, the transfer pathway 24 exists even in the drift layer 13 directly below the base layer 14 whose surface portion has no emitter layer 19. A voltage drop at a depth greater than a depth at which the transfer pathways 24 for electrons transferred from adjacent emitter layers 19 overlap in the y-direction is almost the same as when the emitter layer has a continuous structure.

Figure 5:
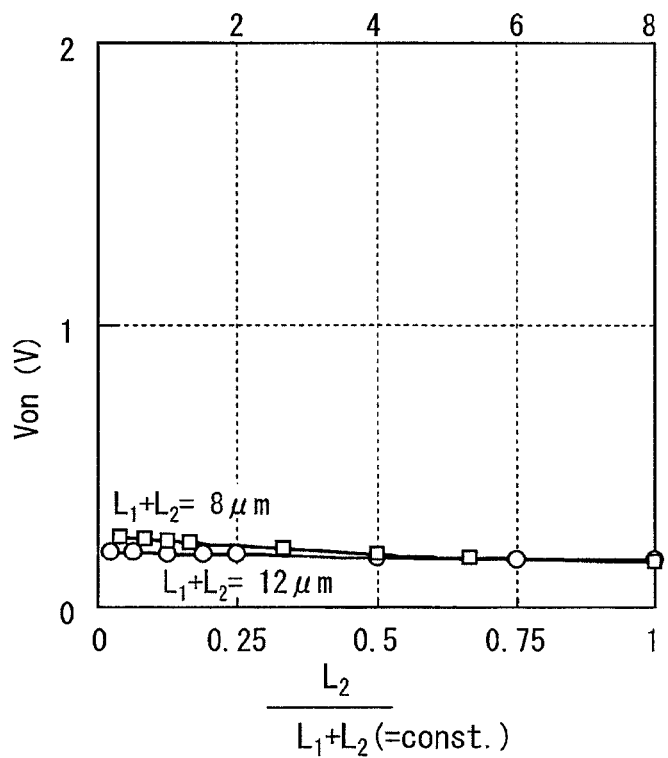
FIG. 5 is a graph showing a dependence of an ON voltage on an emitter width in a drift layer adjacent to a second trench.

FIG. 5 shows a result of simulation conducted to evaluate an ON voltage Von at the drift layer 13 adjacent to the second trench 15*b* under conditions where a gate-emitter voltage Vg is 15V, a collector current is 400 A/cm$^2$, and an operating temperature is 150° C. In this simulation, a pitch $(L_1+L_2)$ of the emitter layer 19 in the y-direction is constant, and the emitter width $L_2$ is variable. FIG. 5 shows a case where $L_1+L_2=12$ μm in addition to a case of the present embodiment $(L_1+L_2=8$ μm). As can be seen from FIG. 5, although the ON voltage Von at the drift layer 13 adjacent to the second trench 15*b* tends to increase with a reduction in the emitter width $L_2$, the ON voltage Von depends little on the emitter width $L_2$ and remains almost constant. That is, even when the emitter layer 19 has a divided structure, an increase in the ON voltage can be reduced.

According to the present embodiment, the emitter interval $L_1$ is set to satisfy the relationship $D_1 \leq L_1 \leq 2(D_1+D_2)$. In this structure, the transfer pathways 24 for electrons transferred from the divided emitter layers 19 to the drift layer 13 overlap at a depth not greater than a depth corresponding to the length $(D_1+D_2)$ of the trench gate 18 in the z-direction. That is, a voltage drop at a portion of the drift layer 13 located at a depth greater than the length $(D_1+D_2)$ measured from the surface of the base layer 14 in the z-direction can be almost the same as when the emitter layer 19 has a continuous structure. In general, in an IGBT element, a ratio of a voltage drop at the drift layer 13 to a voltage drop component is high. According to the present embodiment, since the emitter interval $L_1$ is set to satisfy the relationship $D_1 \leq L_1 \leq 2(D_1+D_2)$, the voltage drop at the drift layer 13 is reduced, so that the increase in the ON voltage is reduced.

Further, according to the present embodiment, the structure satisfies the relationship $D_1 \leq L_1$. When the emitter layer 19 has a divided structure, the saturation current depends on a current density due to electrons transferred from the emitter layer 19 to the drift layer 13 through the inversion layer. That is, when the pitch $(L_1+L_2)$ of the emitter layer 19 is constant, the saturation current depends on the emitter interval $L_1$. Further, as described later with reference to FIG. 6, when the structure satisfies the relationship $D_1 \leq L_1$, the saturation current is effectively reduced.

Figure 6:
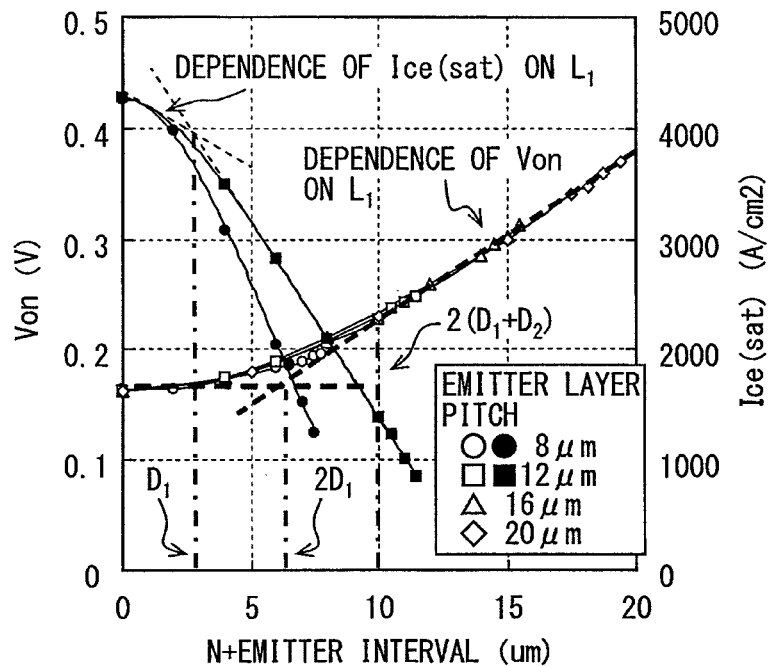
FIG. 6 is a graph showing the dependence of the ON voltage on the saturation current and the emitter width in the drift layer adjacent to the second trench.

FIG. 6 is a two-axis graph showing the ON voltage Von at the drift layer 13 adjacent to the trench 15 and the saturation current Ice (sat) by changing the horizontal axis of FIG. 3 and FIG. 5 to the emitter interval $L_1$. As mentioned previously, when the emitter interval $L_1$ is increased (when the emitter width $L_2$ is reduced), the ON voltage Von increases, and the saturation current Ice(sat) decreases. As shown in FIG. 6, when $L_1>2(D_1+D_2)$, the ON voltage Von has a linear relationship with the emitter interval $L_1$. However, when the emitter interval $L_1$ is reduced to a value not greater than $2(D_1+D_2)$, the ON voltage Von approaches its minimum value (about 0.17V in the present embodiment). That is, when the relationship $L_1 \leq 2(D_1+D_2)$ is satisfied, the increase in the ON voltage Von can be reduced. The saturation current Ice (sat) decreases with the increase in $L_1$. An absolute value of the change rate, i.e., the slope increases with the increase in $L_1$ and then becomes constant (linear). At an intersection between a straight line within the constant region and a tangent line at a point where the emitter interval $L_1$ is zero (a conventional structure where the emitter layer is not divided), the emitter interval $L_1$ is almost the same as $D_1$. Thus, when $L_1$ and $D_1$ have the relationship $D_1 \leq L_1$, the saturation current is effectively reduced. Therefore, like in the present embodiment, when the structure satisfies the relationship $D_1 \leq L_1 \leq 2(D_1+D_2)$, a low ON voltage can be achieved, and also the salutation current can be reduced. That is, the load short-circuit tolerance can be improved.

According to the present embodiment, the emitter interval $L_1$ is about 6.0 μm, and the relationship $D_1 \leq L_1 \leq 2D_1$ is satisfied. As shown in FIG. 6, in a region where the emitter interval $L_1$ satisfies the relationship $D_1 \leq L_1 \leq 2D_1$, the ON voltage Von at the drift layer 13 adjacent to the trench 15 becomes constant at its minimum value (about 0.17V in the present embodiment). Thus, the increase in the ON voltage is more effectively reduced.

Second Embodiment

In the first embodiment, the length $D_1$ of the communication portion 18a in the z-direction is about 3.0 μm, and the length $D_2$ of the bottom portion 18b in the z-direction is about 2.0 μm. In contrast, according to the present embodiment, the length $D_1$ is about 2.4 μm, and the length $D_2$ is about 1.6 μm (0.8 times greater than those of the first embodiment), so that the base layer 14, the emitter layer 19, and the depth of the base layer 14, where the base contact layer 20 is formed, from the surface is 0.8 times greater than those of the first embodiment.

Since a structure other than the above dimension is the same as the first embodiment, the description of details of the other structure is omitted. Further, regarding advantages, since dependencies of factors except the ON voltage on $D_1$, $D_2$, the base layer 14, the emitter layer 19, and the depth of the base layer 14, where the base contact layer 20 is formed, from the surface are small compared to the ON voltage and the same as those in the first embodiment, the description of details is omitted. Therefore, the ON voltage of the present embodiment is described in detail here.

Figure 7:
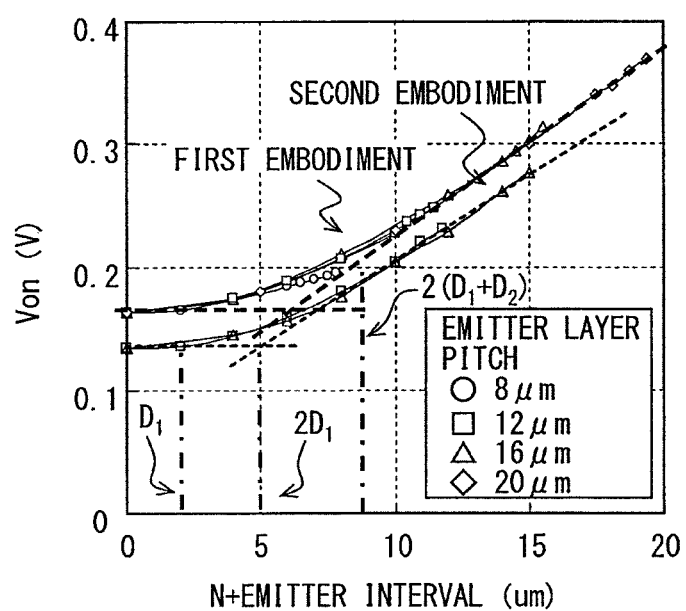
FIG. 7 is a graph showing a dependence of an ON voltage at a drift layer adjacent to a second trench on an emitter interval according to a second embodiment.

As shown in FIG. 7, according to the present embodiment, the dependency of the ON voltage Von at the drift layer 13 adjacent to the trench 15 on the emitter interval $L_1$ shows the same tendency as the first embodiment. That is, when $L_1>2(D_1+D_2)$, the ON voltage Von has a linear relationship with the emitter interval $L_1$. However, when the emitter interval $L_1$ is reduced to a value not greater than $2(D_1+D_2)$, the ON voltage Von approaches its minimum value (about 0.14V in the present embodiment). Even in the present embodiment, the emitter interval $L_1$ is 6 μm, and the ON voltage Von is outside the linear relationship and exists in the region where the ON voltage Von approaches its minimum value of 0.14V. That is, the relationship $L_1 \leq 2(D_1+D_2)$ is satisfied. Therefore, the increase in the ON voltage Von can be reduced.

As shown in FIG. 7, even in the present embodiment, when the emitter interval $L_1$ is set to satisfy the relationship $L_1 \leq 2D_2$, the ON voltage Von at the drift layer 13 adjacent to the trench 15 becomes constant at its minimum value (about 0.14 in the present embodiment) like in the first embodiment. Therefore, the increase in the ON voltage can be more effectively reduced.

Third Embodiment

Figure 8:
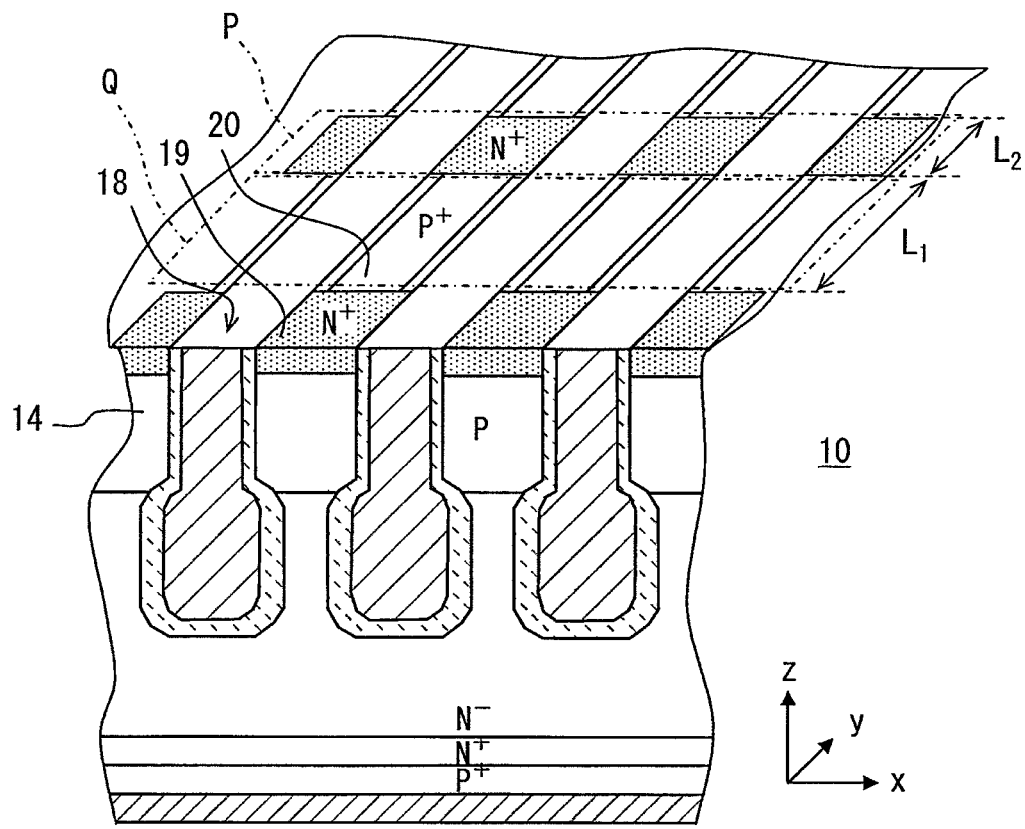
FIG. 8 is an overhead view of a semiconductor device according to a third embodiment.

In the preceding embodiments, the base layer 14 is located between adjacent emitter layers 19 between adjacent gate trenches 18. In contrast, according to the present embodiment, as shown in FIG. 8, the emitter layer 19 is continuous between adjacent trench gates 18 in the x-direction.

According to the present embodiment, the emitter layer 19 is formed in the surface portion of the base layer 14 and continuous between adjacent trench gates 18 in the x-direction. Like in the first embodiment, the base contact layer 20 has the length "C" of about 0.8 μm in the x-direction and is spaced from the trench gate 18. The thickness of the base contact layer 20 from the base layer 14 in the z-direction is the same as that of the emitter layer 19. In this way, the emitter layer 19 and the base contact layer 20 are alternately arranged in the y-direction and extend from the surface of the base layer 14 to the same depth.

According to the present embodiment, a region, which is located between adjacent trench gates 18 and corresponds to the emitter layer 19, corresponds to an effective region P recited in claims. A region between adjacent emitter layers 19 in the y-direction, i.e., a region where the base contact layer 20 is exposed to the surface of the base layer 14 corresponds to an ineffective region Q recited in claims.

This structure allows a contact area between the emitter layer 19 and the emitter electrode 22 to be increased compared to the structures of the preceding embodiments. Accordingly, a contact resistance between the emitter layer 19 and the emitter electrode 22 is reduced, so that the ON voltage is reduced. Therefore, heat generation and power consumption during device operation are reduced.

Figure 9:
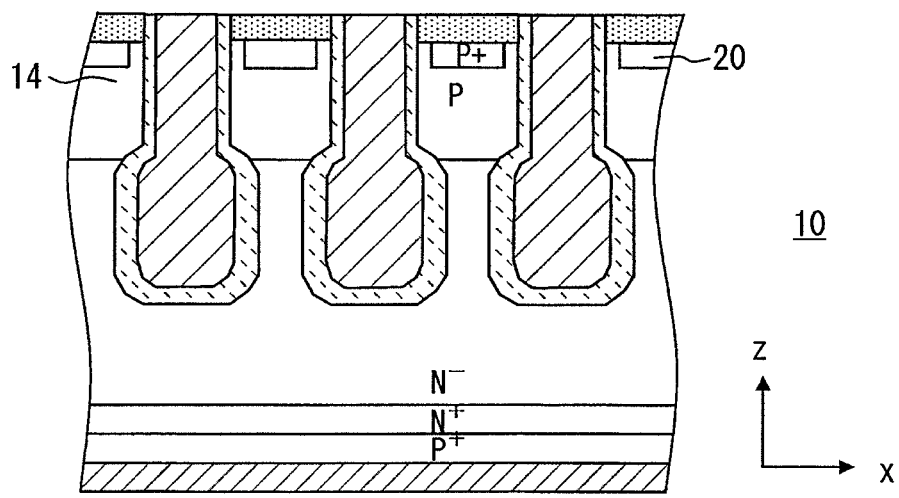
FIG. 9 is a cross-sectional view of a semiconductor device in a x-z plane according to a modification of the third embodiment.

According to the present embodiment, the base contact layer 20 extends from the surface of the base layer 14 to the same depth as the emitter layer 19. Alternatively, as shown in FIG. 9, the base contact layer 20 can extend to a depth greater than a depth to which the emitter layer 19 extends. In this structure, each base contact layer 20 is joined together in the y-direction. That is, in the y-direction, the base contact layer 20 is located not only between the emitter layers 19 but also directly below the emitter layer 19. Thus, dependencies of the potentials of the base contact layer 20 and the base layer 14 on the y-direction are reduced, so that the potentials are stabilized. Therefore, electrical surge tolerance is improved compared to when the base contact layer 20 is divided in the y-direction.

Fourth Embodiment

In the preceding embodiments, the emitter electrode 22 is connected to the base layer 14, the emitter layer 19, and the base contact layer 20 at the surface of the base layer 14. In contrast, according to the present embodiment, the emitter electrode 22 extends to almost the same depth as the emitter layer 19.

Figure 10A:
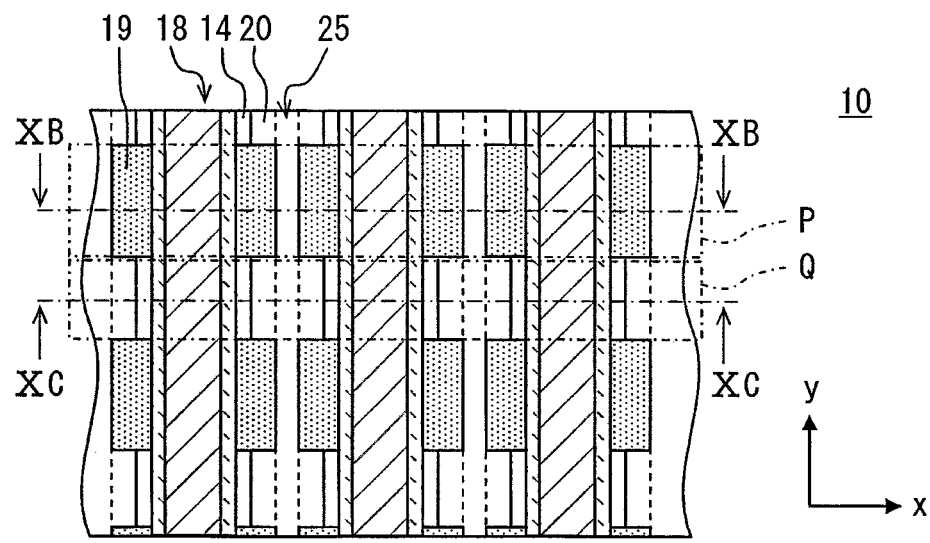
FIG. 10A is a cross-sectional view of a semiconductor device according to a fourth embodiment and shows a cross-sectional view of a surface of a base layer in a x-y plane.
Figure 10B:
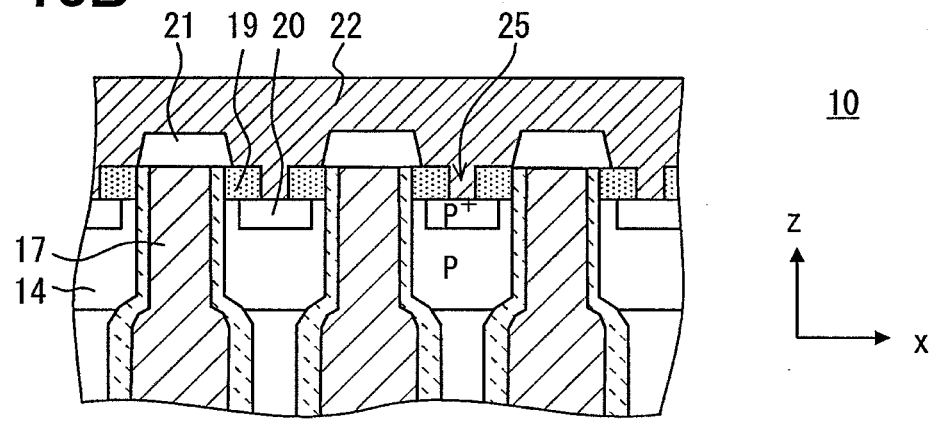
FIG. 10B is a cross-sectional view in a x-z plane taken along XB-XB line.
Figure 10C:
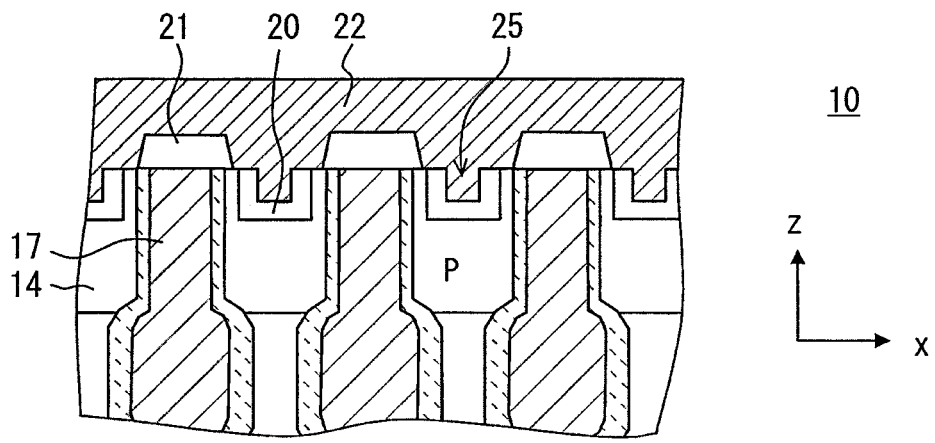
FIG. 10C is a cross-sectional view in the x-z plane taken along XC-XC line.

As shown in FIG. 10A, according to the present embodiment, like in the first and second embodiments, the emitter layer 19 is discontinuous in the x-direction. Further, as shown in FIG. 10B, like in the first and second embodiments, the base contact layer 20 is located in the base layer 14 and extends to a depth greater than a depth to which the emitter layer 19 extends. Further, according to the present embodiment, a contact trench 25 is formed in the base layer 14 between the emitter layers 19 between adjacent trench gates 18, i.e., formed in a region where the base contact layer 20 is formed. The contact trench 25 extends from the surface of the base layer 14 to almost the same depth as the emitter layer 19 and also extends in the y-direction. A side of the contact trench 25 is in contact with a side of the emitter layer 19, and a bottom of the contact trench 25 is in contact with the base contact layer 20. In contrast, in a region between the emitter layers 19 in the y-direction, the base contact layer 20 is in contact with the side and the bottom of the contact trench 25. Thus, as shown in FIG. 10C, the base contact layer 20 has a rectangular U shape in cross-section along the x-z plane. The emitter electrode 22 is formed on the surface of the base layer 14 and inside the contact trench 25. Like in the first and second embodiments, the interlayer dielectric film 21 is formed on the surface of the gate electrode 17 of the trench gate 18 to insulate the gate electrode 17 from the emitter electrode 22.

Like in the first end second embodiments, a region, which is located between adjacent trench gates 18 and where the emitter layer 19 is formed in the y-direction, corresponds to an effective region P recited in claims. A region, which is located between adjacent effective regions P in the y-direction, corresponds to an ineffective region Q recited in claims.

In this structure, the emitter electrode 22 is in contact with the emitter layer 19 not only on the x-y plane parallel to the surface of the base layer 14, but also on the y-z plane parallel to the side of the emitter layer 19. Thus, the contact area between the emitter layer 19 and the emitter electrode 22 is increased compared to when the emitter electrode 22 is connected to the emitter layer 19 only on the x-y plane parallel to the surface of the base layer 14. Accordingly, the contact resistance between the emitter layer 19 and the emitter electrode 22 is reduced, and the ON voltage is reduced. Further, a contact area between the base contact layer 20 and the emitter electrode 22 is increased compared to when the emitter electrode 22 is connected to the base contact layer 20 only on the x-y plane parallel to the surface of the base layer 14. Thus, the potentials of the base layer 14 and the base contact layer 20 are stabilized, so that the electrical surge tolerance is improved.

Fifth Embodiment

In the preceding embodiments except the fourth embodiment, the divided emitter layer 19 formed on the side of one trench gate 18 is located at the same portion as the divided emitter layer 19 formed on the side of the other trench gate 18 between adjacent trench gates 18 in the y-direction. However, it is not always essential that the emitter layers 19 are located at the same position in the y-direction.

Figure 11:
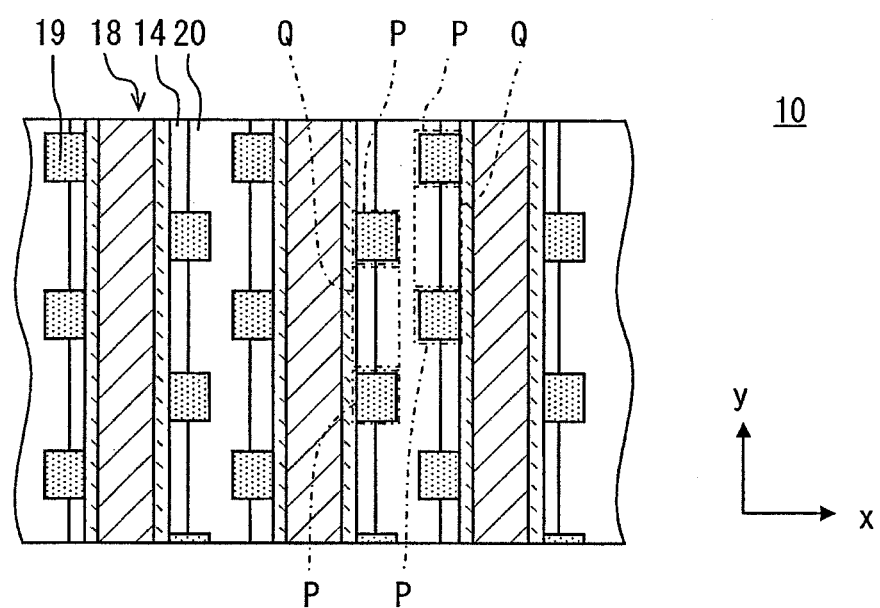
FIG. 11 is a cross-sectional view of a semiconductor device according to a fifth embodiment and shows a cross-sectional view of a surface of a base layer in a x-y plane.

According to the present embodiment, as shown in FIG. 11, the emitter layer 19 formed on the side of one trench gate 18 can alternate with the emitter layer 19 formed on the side of the other trench gate 18 between adjacent trench gates 18. That is, the emitter layers 19 located adjacent to each other in the x-direction have the same $L_1$ and $L_2$ and are misaligned with each other in the y-direction.

According to the present embodiment, a region, where the emitter layer 19 is formed, corresponds to an effective region P recited in claims. A region, which is located between adjacent effective regions P in the y-direction, corresponds to an ineffective region Q recited in claims.

Figure 12:
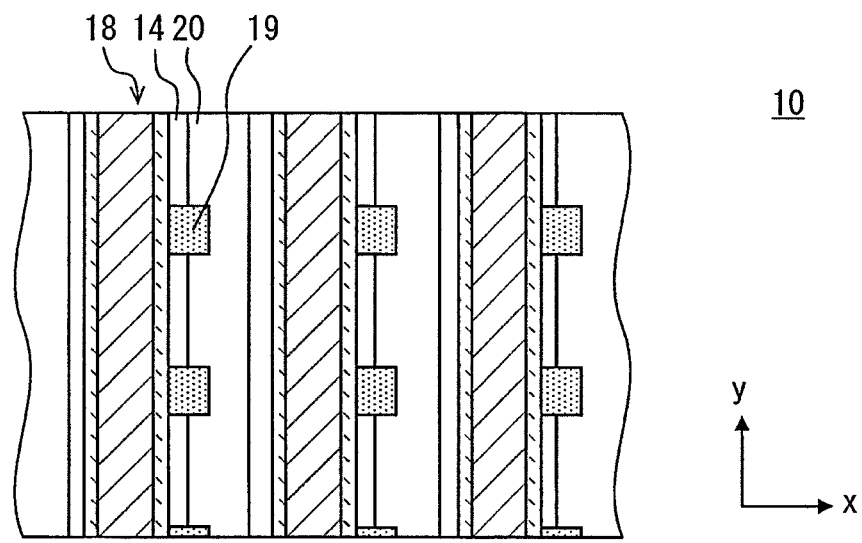
FIG. 12 is a cross-sectional view of a semiconductor device according to a modification of the fifth embodiment and shows a cross-sectional view of a surface of a base layer in a x-y plane.
Figure 13:
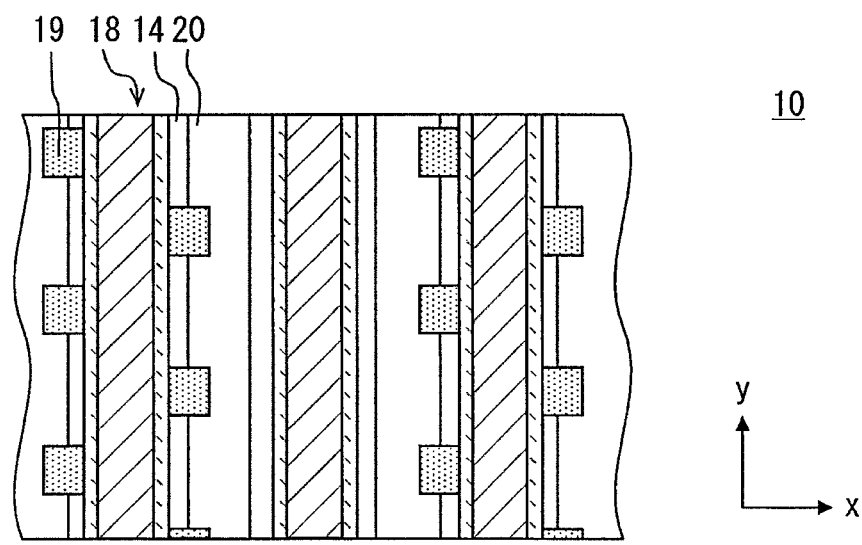
FIG. 13 is a cross-sectional view of a semiconductor device according to another modification of the fifth embodiment and shows a cross-sectional view of a surface of a base layer in a x-y plane.

In this structure, dependency of an emitter-drift current density on the x-y plane is reduced compared to the structures of the preceding embodiments. That is, an emitter-drift current can be constant regardless of a position on the x-y plane. Thus, variations among IGBTs in the saturation current and the ON voltage can be reduced. According to the present embodiment, the emitter layers 19 located adjacent to each other in the x-direction alternate with each other. However, it is not limited to this example. For example, the emitter layers 19 located adjacent to each other in the x-direction can have different $L_1$ and $L_2$, and the amount of displacement in the y-direction is not limited to a specific value. According to the present embodiment, as shown in FIG. 11, the emitter layer 19 is formed on each side of each of adjacent trench gates 18. However, it is not limited to this example. For example, as shown in FIG. 12, the emitter layer 19 can be formed on one side of the trench gate 18. Specifically, the emitter layer 19 can be formed on the same one side of each of adjacent trench gates 18 in the x-direction. Alternatively, as shown in FIG. 13, a trench gate 18, on each side of which the emitter layer 19 is formed, and a trench gate 18, on each side of which no emitter layer 19 is formed, can be alternately arranged in the x-direction. In the structures shown in FIGS. 12 and 13, the area ratio of the emitter layer 19 is reduced compared to the structure shown in FIG. 11. Therefore, the saturation current can be further reduced.

Sixth Embodiment

Figure 14:
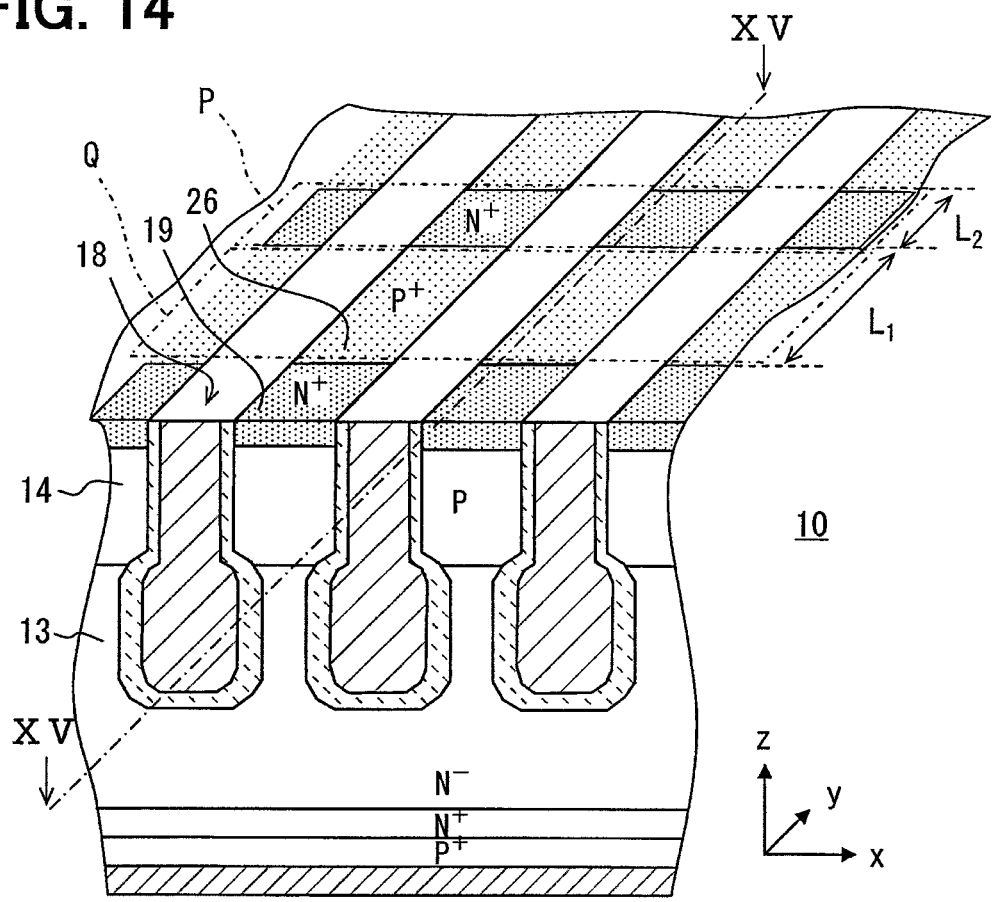
FIG. 14 is an overhead view of a semiconductor device according to a sixth embodiment.

In the preceding embodiments, the base contact layer 20 is exposed to the surface of the base layer 14 between adjacent emitter layers 19 in the y-direction. In the preceding embodiments, the base contact layer 20 extends in the y-direction to penetrate the effective region P and the ineffective region Q and is not in contact with the trench gate 18. In contrast, according to the present embodiment, as shown in FIG. 14, a $P^+$-type first high concentration base region 26 is formed in the surface portion of the base layer 14 in the ineffective region Q. A concentration of the first high concentration base region 26 is higher than that of the base layer 14 and lower than that of the emitter layer 19. The first high concentration base region 26 is in contact with the side of the trench gate 18 and extends from the surface of the base layer 14 to a depth greater than a depth to which the emitter layer 19 extends. The emitter layer 19 in the effective region P is formed in the surface portion of the base layer 14 between adjacent trench gates 18 and continuous in the x-direction.

This structure allows a contact resistance between the emitter electrode 22, which is formed on the surfaces of the emitter layer 19 and the base layer 14, and the base layer 14 to be reduced compared to a structure having no first high concentration base region 26. Thus, the potential of the base layer 14 is stabilized, so that the electrical surge tolerance is improved. It is not always essential that the high concentration base region 26 is in contact with the trench gate 18. However, like in the present embodiment, when the first high concentration base region 26 is in contact with the trench gate 18 in the x-direction, the base layer 14 (the high concentration base region 26) near the trench gate 18 in the ineffective region Q is less likely to be inverted. Further, it is not always essential that the high concentration base region 26 extends to the depth greater than the depth to which the emitter layer 19 extends. According to the present embodiment, the base contact layer 20 is not included. Alternatively, the base contact layer 20 can be included. In this case, it is preferable that the base contact layer 20 should extend in the y-direction to penetrate the effective region P and the ineffective region Q in such a manner that the base contact layer 20 is in contact with the emitter layer 19 but is not contact with the trench gate 18 in the z-direction.

Figure 15:
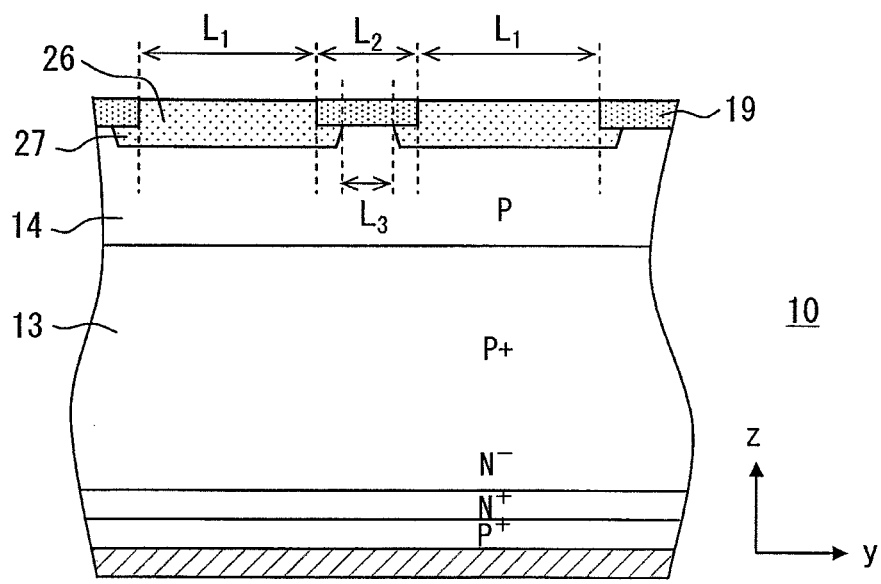
FIG. 15 is a cross-sectional view of the semiconductor device according to the sixth embodiment in a y-z plane taken along XV-XV line in FIG. 14.

According to the present embodiment, the first high concentration base region 26 extends from the surface of the base layer 14 to the depth greater than the depth to which the emitter layer 19 extends. Therefore, as shown in FIG. 15, dopants of the first high concentration base region 26 are thermally diffused to a portion 27 below the emitter layer 19, i.e., a portion in contact with the emitter layer 19 in the z-direction. Thus, as shown in FIG. 15, an impurity concentration of the portion 27 of the base layer 14 below the emitter layer 19 can become higher than that of the other portion of the base layer 14. Therefore, an effective length $L_3$ of an injection source (emitter layer 19) for injecting electrons into the drift layer 13 can be made smaller than the actual length $L_2$ of the emitter layer 19. Thus, the saturation current can be reduced.

Seventh Embodiment

Figure 16:
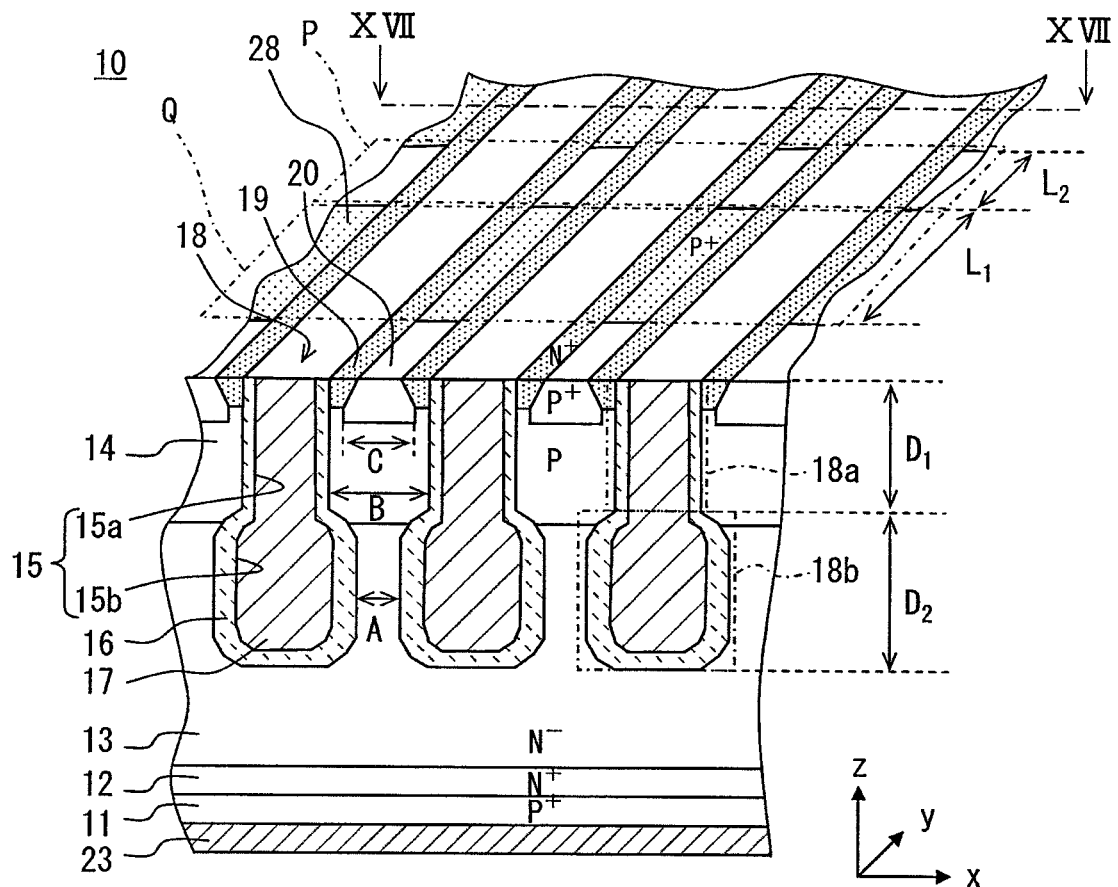
FIG. 16 is an overhead view of a semiconductor device according to a seventh embodiment.

In the preceding embodiments, a region corresponding to the emitter layer 19 divided in the y-direction serves as an effective region P. In contrast, according to the present embodiment, as shown in FIG. 16, the emitter layer 19 continuously extends in the y-direction. Further, a $P^+$-type second high concentration base region 28 having the length $L_1$ in the y-direction is formed in the surface portion of the base layer 14 between adjacent trench gates 18. Since the structure except the emitter layer 19 and the second high concentration base region 28 is the same as that in the first embodiment, the description of details is omitted.

Figure 17:
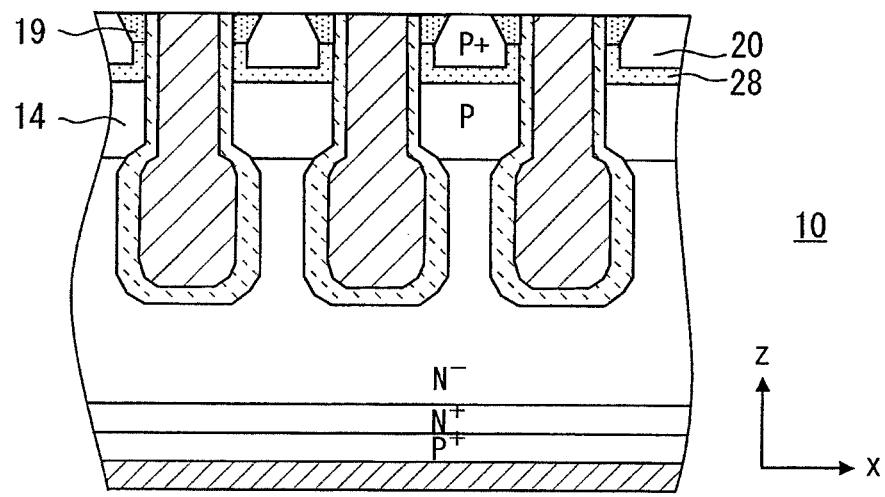
FIG. 17 is a cross-sectional view of the semiconductor device according to the seventh embodiment in a x-z plane taken along XVII-XVII line in FIG. 16.

An impurity concentration of the second high concentration base region 28 is higher than that of the base layer 14 and lower than that of the emitter layer 19. The second high concentration base region 28 is in contact with the emitter layer 19 in the z-direction and in contact with the trench gate 18 in the x-direction. Further, the second high concentration base region 28 is divided and arranged at the interval $L_2$ in the y-direction. As shown in FIG. 17, the second high concentration base region 28 extends to a depth greater than the depth to which the emitter layer 19 extends. The second high concentration base region 28 is in contact with the trench gate 18. The concentration of the second high concentration base region 28 is higher than that of the base layer 14. Therefore, when a voltage is applied to the gate electrode 17, a region between the emitter layer 19 and the drift layer 13 is less likely to be inverted compared to the structure having no second high concentration base region 28. Thus, a region corresponding to the second high concentration base region 28 serves as an ineffective region Q where no electron is injected into the drift layer 13. A region between adjacent ineffective regions Q in the y-direction serves as an effective region P where electrons are injected into the drift layer 13 from the emitter layer 19 upon application of the voltage to the gate electrode 17. According to the present embodiment, as shown in FIGS. 16 and 17, the base contact layer 20 extends in the y-direction to penetrate the effective region P and the ineffective region Q.

Even in the present embodiment, the effective region P is divided and arranged at the interval $L_1$ in the y-direction. Therefore, the same advantages as the first and second embodiments can be obtained.

Eighth Embodiment

Like in the fourth embodiment as a modification of the first embodiment, in the present embodiment, the seventh embodiment is modified so that the emitter electrode 22 extends to almost the same depth as the emitter layer 19.

Figure 18A:
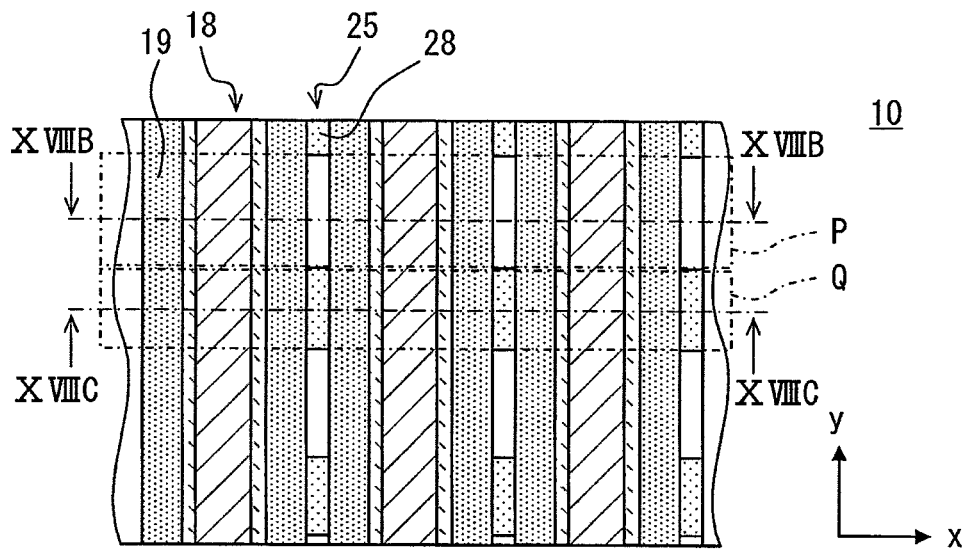
FIG. 18A is a cross-sectional view of a semiconductor device according to an eighth embodiment and shows a cross-sectional view of a surface of a base layer in a x-y plane.
Figure 18B:
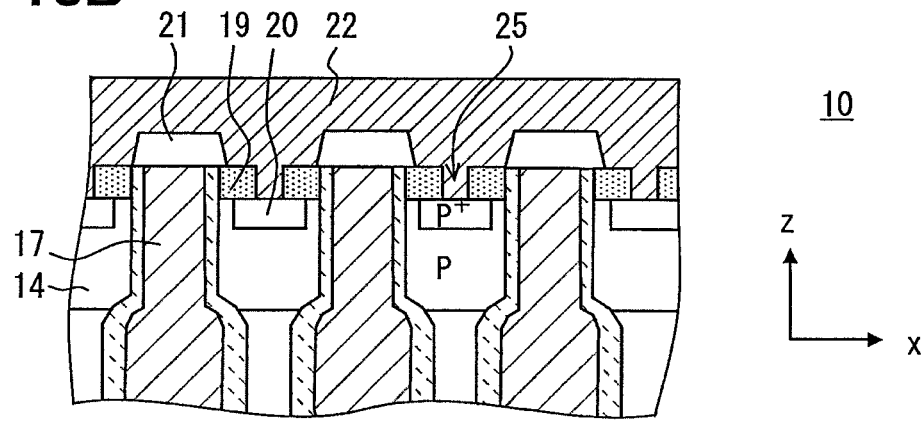
FIG. 18B is a cross-sectional view in a x-z plane taken along XVIIIB-XVIIIB line.
Figure 18C:
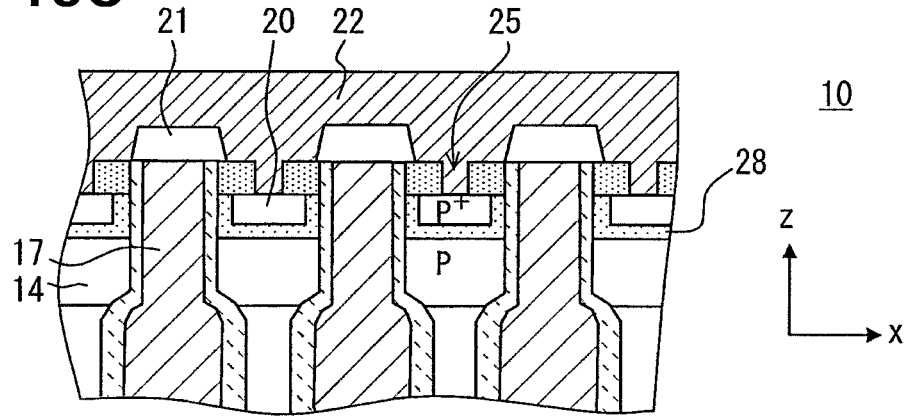
FIG. 18C is a cross-sectional view in the x-z plane taken along XVIIIC-XVIIIC line.

As shown in FIG. 18A, according to the present embodiment, like in the seventh embodiment, the emitter layer 19 continuously extends in the y-direction. Further, as shown in FIG. 18B, like in the seventh embodiment, the base contact layer 20 is located in the base layer 14 and extends to a depth greater than a depth to which the emitter layer 19 extends. Further, a contact trench 25 is formed in the base layer 14 between the emitter layers 19 between adjacent trench gates 18, i.e., formed in a region where the base contact layer 20 is formed. The contact trench 25 extends from the surface of the base layer 14 to almost the same depth as the emitter layer 19 and also extends in the y-direction. A side of the contact trench 25 is in contact with a side of the emitter layer 19, and a bottom of the contact trench 25 is in contact with the base contact layer 20. In contrast, as shown in FIG. 18C, in a region between the emitter layers 19 in the ineffective region Q, the base contact layer 20 is located in the base layer 14 and extends to a depth greater than a depth to which the emitter layer 19 extends. Further, the second high concentration base region 28 extends to a depth greater than the depth to which the emitter layer 19 extends. The second high concentration base region 28 is in contact with the emitter layer 19 and the side of the trench gate 18. Like in the first and second embodiments, the interlayer dielectric film 21 is formed on the surface of the gate electrode 17 of the trench gate 18 to insulate the gate electrode 17 from the emitter electrode 22.

Even in this structure, the effective region P is divided in the y-direction. Further, like in the fourth embodiment, the contact trench 25 is formed. Therefore, the same advantages as the fourth embodiment can be obtained.

Other Embodiments

While the present disclosure has been described with reference to embodiments thereof, it is to be understood that the disclosure is not limited to the embodiments. The present disclosure is intended to cover various modifications and equivalent arrangements within the spirit and scope of the present disclosure.

In the sixth embodiment, the ineffective region Q has the first high concentration base region 26. In the sixth embodiment, the emitter layer 19 as the effective region P is formed in the surface portion of the base layer 14 between adjacent trench gates and continuously extends in the x-direction. However, when the first high concentration base region 26 is included, it is not always essential that the emitter layer 19 continuously extends in the x-direction. Like in the first embodiment, when the ineffective region Q has the first high concentration base region 26, the emitter layer 19 can be divided in the x-direction.

In the embodiments, the IGBT element is formed in a substrate where the buffer layer 12 is formed on the collector layer 11. However, it is not limited to this example. For example, a field stop layer can be formed instead of the buffer layer 12, or no buffer layer 12 can be formed.

What is claimed is:

1. A semiconductor device comprising:
a first-conductivity-type collector layer along a x-y plane defined by a x-direction and a y-direction which are orthogonal to each other;
a second-conductivity-type drift layer formed on a front side of the collector layer;
a first-conductivity-type base layer formed on the drift layer;
trench gates including trenches extending in the y-direction to form a pattern of stripes, the trenches extending from a surface of the base layer along the x-y plane to an inside of the drift layer by penetrating the base layer in a z-direction orthogonal to the x-y plane, the trench gates further including a gate insulation layer formed on walls of the trenches and a gate electrode formed on the gate insulation layer;
a second-conductivity-type emitter layer formed in a surface portion of the base layer and located on a side of the trench gates;
a collector electrode formed on a back side of the collector layer and electrically connected to the collector layer; and an emitter electrode electrically connected to the emitter layer and the base layer, wherein the trench gate includes a bottom portion located in the drift layer and a communication portion extending from the surface of the base layer to communicate with the bottom portion, a distance between adjacent bottom portions in the x-direction is smaller than a distance between adjacent communication portions in the x-direction, the gate insulation layer is thicker in the bottom portion than in the communication portion, a region between adjacent trench gates is divided into an effective region and an ineffective region in the y-direction, the effective region corresponds to the emitter layer and serves as an injection source for injecting charges into the drift layer when a voltage is applied to the gate electrode, the ineffective region does not serve as the injection source even when the voltage is applied to the gate electrode, and an interval $L_1$ (>0) of the ineffective region in the y-direction, a length $D_1$ of the communication portion in the z-direction, and a length $D_2$ of the bottom portion in the z-direction satisfy the following relationship: $L_1 \leq 2(D_1 + D_2)$.

2. The semiconductor device according to claim 1, wherein the effective region is arranged at the interval $L_1$ in the y-direction, and the ineffective region is located between adjacent effective regions in the y-direction.

3. The semiconductor device according to claim 2, further comprising:

a first-conductivity-type first high concentration base region formed in the surface portion of the base layer in the ineffective region, wherein an impurity concentration of the first high concentration base region is higher than that of the base layer.

4. The semiconductor device according to claim 1, wherein the emitter layer continuously extends in the y-direction along the trench gate, the ineffective region includes a first-conductivity-type second high concentration base region having an impurity concentration higher than that of the base layer and lower than that of the emitter layer, the second high concentration base region is intermittently divided and arranged at the interval $L_1$ in the y-direction, the second high concentration base region is located in the base layer, the second high concentration base region is in contact with the emitter layer in the z-direction and in contact with the trench gate in the x-direction, and the effective region is located between adjacent second high concentration base regions.

5. The semiconductor device according to claim 1, wherein the $L_1$ and the $D_1$ satisfy the following relationship: $L_1 \leq 2D_1$.

6. The semiconductor device according to claim 1, wherein the $L_1$ and the $D_1$ satisfy the following relationship: $D_1 \leq L_1$.

7. The semiconductor device according to claim 1, wherein the effective region has a periodic structure so that the interval $L_1$ and a length $L_2$ of the effective region in the y-direction are constant.

8. The semiconductor device according to claim 1, further comprising:

a first-conductivity-type base contact layer formed in the surface portion of the base layer within the emitter layer between adjacent trench gates, wherein the base contact layer extends to a depth greater than a depth to which the emitter layer extends, and a length of the base contact layer in the x-direction is greater than the distance between adjacent bottom portions.

* * * * *